(12) United States Patent
Kano

(10) Patent No.: US 6,188,082 B1
(45) Date of Patent: Feb. 13, 2001

(54) DIODES WITH QUANTUM-WAVE INTERFERENCE LAYERS

(75) Inventor: Hiroyuki Kano, Aichi-ken (JP)

(73) Assignee: Canare Electric Co., Ltd., Aichi-gun (JP)

( * ) Notice: Under 35 U.S.C. 154(b), the term of this patent shall be extended for 0 days.

(21) Appl. No.: 09/057,549

(22) Filed: Apr. 9, 1998

(30) Foreign Application Priority Data

Apr. 25, 1997 (JP) ...................................... 9-123482

(51) Int. Cl.$^7$ .................................................. H01L 29/06
(52) U.S. Cl. .................................. 257/17; 257/9; 257/12; 257/14; 257/15
(58) Field of Search ...................................... 257/9, 12–15, 257/17, 19, 20, 21, 24, 79, 94, 96, 97, 183, 184, 186, 187, 192, 199–201, 431, 438, 461, 613–616, 18, 22, 26

(56) References Cited

U.S. PATENT DOCUMENTS 5,091,756   2/1992   Iga et al. .

FOREIGN PATENT DOCUMENTS 0 485 237   5/1992   (EP) .
0 569 258   11/1993  (EP) .

OTHER PUBLICATIONS

Takeshi Takagi, et al., Japanese Journal of Applied Physics, vol. 29, No. 11, pp. L 1977–L 1980, Nov. 1990, "Potential Barrier Height Analysis of Algainp Multi–Quantum Barrier (MQB)".

Takeshi Takagi, et al., Tokyo Institute of Technology, OQE91–13, pp. 73–78, "Design of Multi–Quantum Barrier (MQB) and Experimental Verification of MQB Effect" (with partial English translation).

Akihiko Kikuchi, et al., Faculty of Science and Technology Sophia University, ED91–3, pp. 15–21, "Design of Algainp Multi–Quantum–Barrier".

Primary Examiner—Jerome Jackson, Jr.
Assistant Examiner—Bradley William Baumeister
(74) Attorney, Agent, or Firm—Oblon, Spivak, McClelland, Maier & Neustadt, P.C.

(57) ABSTRACT

A diode is constituted by a quantum-wave interference layer with plural periods of a pair of a first layer W and a second layer B, having at least one quantum-wave interference layer in a p-layer or an n-layer. The second layer B has wider band gap than the first layer W. Each thickness of the first layer W and the second layer B is determined by multiplying by an odd number one fourth of quantum-wave wavelength of carriers in each of the first layer W and the second layer B existing around the lowest energy level of the second layer B. A $\delta$ layer, for sharply varying an energy band, is formed at an every interface between the first layer W and the second layer B and has a thickness substantially thinner than the first layer W and the second layer B. The quantum-wave interference layer functions as a reflecting layer of carriers for higher reflectivity.

8 Claims, 10 Drawing Sheets

F I G. 3
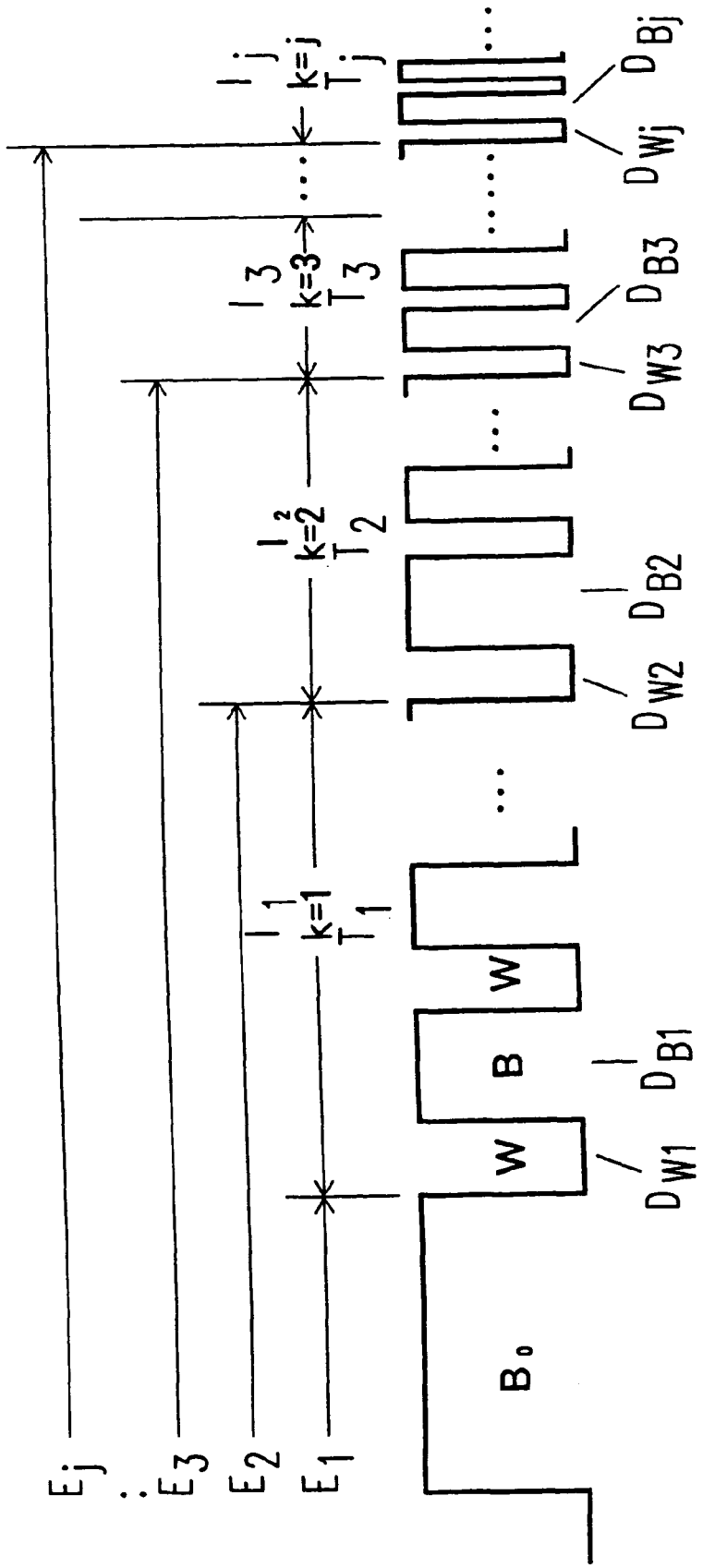

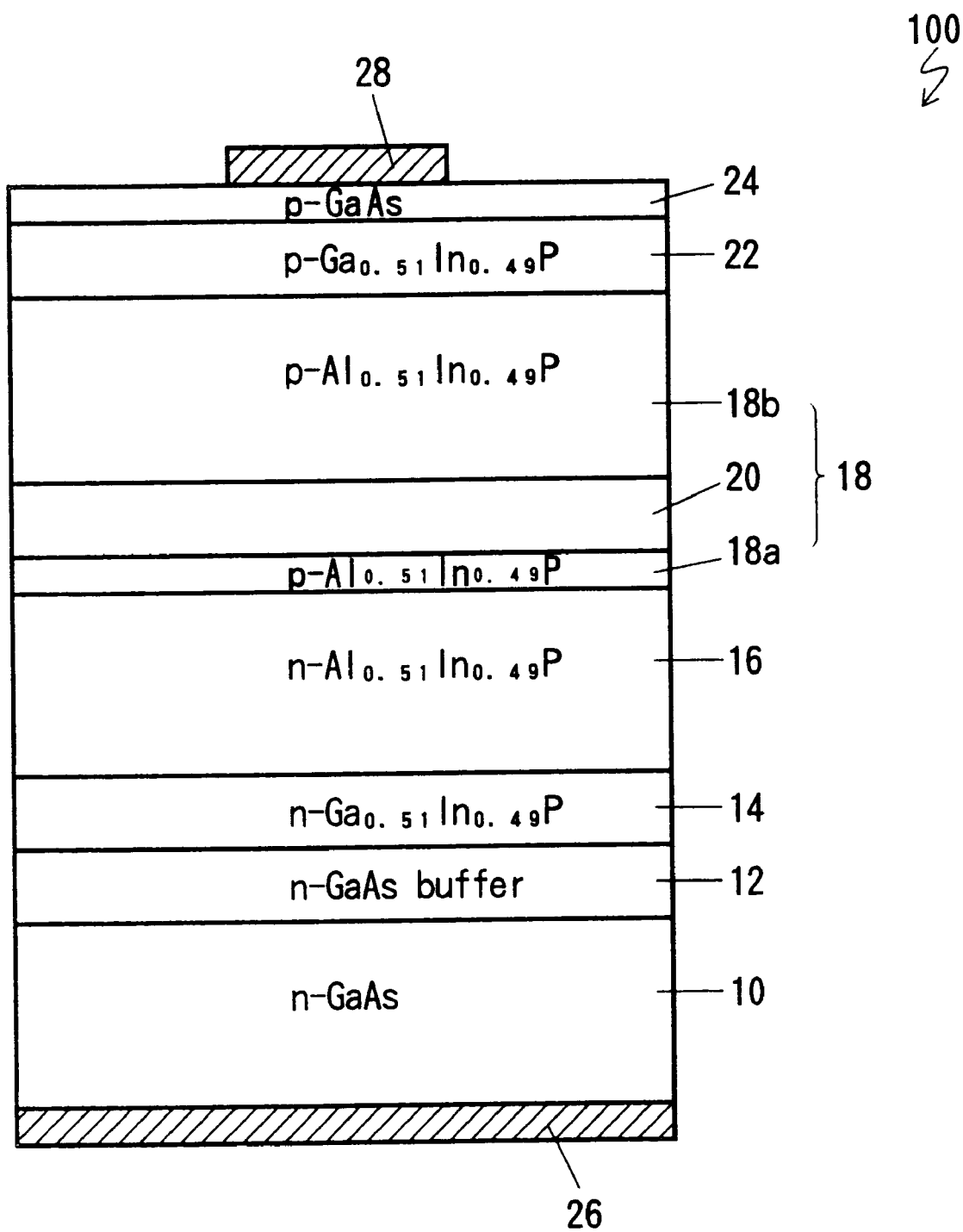

DIODES WITH QUANTUM-WAVE INTERFERENCE LAYERS

BACKGROUND OF THE INVENTION

1. Field of the Invention

The present invention relates to a diode having a structure with whose dynamic resistance lowered.

2. Description of the Related Art

A diode which has a pn junction has been known. Electric current, which flows when the forward voltage is applied to the diode, increases rapidly at the point where the forward voltage exceeds the potential difference between the conduction bands of p and n layers. The larger gradient of the characteristic curve between electric current and voltage in the dynamic range is, the more suitable the diode becomes to use as various devices.

However, a problem persists in the gradient. The gradient of electric current and voltage characteristics could not be varied because it is determined by materials which form the diode. Therefore, further improvement has been required, as presently appreciated by the present inventors.

As a countermeasure, reflecting carriers by forming cladding layers with multi-quantum well structure of a series of a pair of a first and a second layers has been suggested by Takagi et al. (Japanese Journal of Applied Physics. Vol. 29, No. 11, November 1990, pp. L1977–L1980). This reference, however, does not teach or suggest the values of the kinetic energy of carriers to be considered and the degree of reflectivity of carriers is inadequate.

SUMMARY OF THE INVENTION

The inventors of the present invention conducted a series of experiments and found that the suggested thicknesses of the first and the second layers by Takagi et al. were too small to reflect carriers, and that preferable thicknesses of the first and second layers are 4 to 6 times larger than those suggested by Takagi et al. Further, the present inventors thought that multiple reflection of quantum-waves of carriers might occur by a multi-layer structure with different band width, like multiple reflection of light by a dielectric multi-film structure. And the inventors thought that it would be possible to vary the V-I characteristic of carriers when the external voltage is applied to the diode by the quantum-wave reflection. As a result, the inventors invented a preferable quantum-wave interference layer and applications of the same.

It is, therefore, the object of the present invention to provide a diode with considerably lower dynamic resistance by forming a quantum-wave interference layer in a p-layer or an n-layer.

In the light of the object a first aspect of the present invention is a diode constituted by forming a quantum-wave interference layer having plural periods of a pair of a first layer and a second layer in at least one of a p-layer and an n layer, the second layer having a wider band gap than the first layer. Each thickness of the first and the second layers is determined by multiplying by an odd number one fourth of quantum-wave wavelength of injected minority carriers in each of the first and the second layers.

The second aspect of the present invention is a diode constituted by a quantum-wave interference layer having plural periods of a pair of a first layer and a second layer. The second layer has a wider band gap than the first layer. A δ layer is included for sharply varying energy band and is formed between the first and the second layers. Each thickness of the first and the second layers in the p-layer or the n-layer is determined by multiplying by odd number one fourth of quantum-wave wavelength of injected minority carriers in each of the first and the second layers, and a thickness of the δ layer is substantially thinner than that of the first and the second layers.

The third aspect of the present invention is a diode having injected carriers existing around the lowest energy level of the second layer.

The fourth aspect of the present invention is to define each thickness of the first and second layers as follows:

$$D_W = n_W \lambda_W/4 = n_W h/4[2m_W(E+V)]^{1/2} \quad (1)$$

and $$D_B = n_B \lambda_B/4 = n_B h/4(2m_B E)^{1/2} \quad (2)$$

In Eqs. 1 and 2, h, $m_W$, $m_B$, E, V, and $n_W$, $n_B$ represent a plank constant, effective mass of minority carrier injected into the first layer, effective mass of minority carriers in the second layer, kinetic energy of minority carriers injected into the second layer, potential energy of the second layer to the first layer, and odd numbers, respectively. And minority carrier injected into the second layer is preferably exist around the lowest energy level of the second layer.

The fifth aspect of the present invention is a diode having a plurality of partial quantum-wave interference layers $I_k$ with arbitrary periods $T_k$ including a first layer having a thickness of $D_{Wk}$ and a second layer having a thickness of $D_{Bk}$ and arranged in series. The thicknesses of the first and the second layers satisfy the formulas:

$$D_{Wk} = n_{Wk} \lambda_{Wk}/4 = n_{Wk} h/4[2m_{Wk}(E_k+V)]^{1/2} \quad (3)$$

and $$D_{Bk} = n_{Bk} \lambda_{Bk}/4 = n_{Bk} h/4(2m_{Bk} E_k)^{1/2} \quad (4).$$

In Eqs. 3 and 4, $E_k$, $m_{Wk}$, $m_{Bk}$, and $n_{Wk}$ and $n_{Bk}$ represent plural kinetic energy levels of minority carriers injected into the second layer, effective mass of minority carriers with kinetic energy $E_k+V$ in the first layer, effective mass of minority carriers with kinetic energy $E_k$ in the second layer, and arbitrary odd numbers, respectively.

The plurality of the partial quantum-wave interference layers $I_k$ are arranged in series from $I_1$ to $I_j$, where j is a maximum number of k required to form a quantum-wave interference layer as a whole.

The sixth aspect of the present invention is a diode having a quantum-wave interference layer with a plurality of partial quantum-wave interference layers arranged in series with arbitrary periods. Each of the plurality of partial quantum-wave interference layers is constructed with serial pairs of the first and second layers. The widths of the first and second layers of the serial pairs are represented by $(D_{W1}, D_{B1}), \ldots, (D_{Wk}, D_{Bk}), \ldots, (D_{Bj}, D_{Bj})$. $(D_{Wk}, D_{Bk})$ is a pair of widths of the first and second layers and is defined as Eqs 3 and 4, respectively.

The seventh aspect of the present invention is to form a δ layer between a first layer and a second layer which sharply varies the energy band and has a thickness substantially thinner than that of the first and the second layers.

The eighth aspect of the present invention is to constitute a quantum-wave incident facet in the quantum-wave interference layer by a second layer with enough thickness for preventing conduction of minority carriers injected into the first layer by a tunneling effect.

(first and fourth aspects of the invention)

The principle of the quantum-wave interference layer of the present invention is explained hereinafter. FIG. 1 shows a conduction band of a multi-layer structure, formed in a p-layer, with plural periods of a pair of a first layer W and a second layer B. A band gap of the second layer B is wider than that of the first layer W. Electrons, or minority carriers, which have been injected into the p-layer, conduct from left to right as shown by an arrow in FIG. 1. Among the electrons, those that exist around the bottom of the second layer B are likely to contribute to conduction. The electrons around the bottom of the second layer B has a kinetic energy E. Accordingly, the electrons in the first layer W have a kinetic energy E+V which is accelerated by potential energy V due to the band gap between the first layer W and the second layer B. In other words, electrons that move from the first layer W to the second layer B are decelerated by potential energy V and return to the original kinetic energy E in the second layer B. As explained above, kinetic energy of electrons in the conduction band is modulated by potential energy due to the multi-layer structure.

When thicknesses of the first layer W and the second layer B are equal to order of a quantum-wave wavelength, electrons tend to have characteristics of a wave. The wave length of the electron quantum-wave is calculated by Eqs. 1 and 2 using kinetic energy of the electron. Further, defining the respective wave number vector in first layer W and second layer B as $K_W$ and $K_B$, reflectivity R of the wave is calculated by:

$$R=(|K_W|-|K_B|)/(|K_W|+|K_B|)$$

$$=([m_W(E+V)]^{1/2}-[m_BE]^{1/2})/([m_W(E+V)]^{1/2}+[m_BE]^{1/2})$$

$$=[1-(m_BE/m_W(E+V))^{1/2}]/[1+(m_BE/m_W(E+V))^{1/2}] \quad (5).$$

Further, when $m_B=m_W$, the reflectivity R is calculated by:

$$R=[1-(E/(E+V))^{1/2}]/[1+(E/(E+V))^{1/2}] \quad (6).$$

When E/(E+V)=x, Eq. 6 is transformed into:

$$R=(1-x^{1/2})/(1+x^{1/2}) \quad (7).$$

The characteristic of the reflectivity R with respect to energy ratio x obtained by Eq. 7 is shown in FIG. 2.

When the second layer B and the first layer W have S periods, the reflectivity $R_S$ on the incident facet of a quantum-wave is calculated by:

$$R_S=[(1-x^S)/(1+x^S)]^2 \quad (8).$$

When the formula $x \leq 1/10$ is satisfied, $R \geq 0.52$. Accordingly, the relation between E and V is satisfied with:

$$E \leq V/9 \quad (9).$$

Since the kinetic energy E of conducting electrons in the second layer B exists around the bottom of the conduction band, the relation of Eq. 9 is satisfied and the reflectivity R at the interface between the second layer B and the first layer W becomes 52% or more. Consequently, the multi-quantum well structure having two kinds of layers with different band gaps to each other enables effective quantum-wave of the electrons injected into the p-layer reflection.

Further, utilizing the energy ratio x enables thickness ratio $D_B/D_W$ of the second layer B to the first layer W to be obtained by:

$$D_B/D_W=[m_W/(m_Bx)]^{1/2} \quad (10).$$

Until the kinetic energy of electrons injected into a p-layer exceeds the energy level used to design a thickness of a quantum-wave interference layer substantially when the external voltage is applied to a diode having a quantum-wave interference layer in the p-layer, electrons are reflected and do not cause electric current. When the kinetic energy of the electrons substantially exceeds the energy level used to design the quantum-wave interference layer, reflected electrons begin to flow rapidly. Consequently, the V-I characteristic of the diode varies sharply, or a dynamic resistance of the diode drops.

Thicknesses of the first layer W and the second layer B are determined for selectively reflecting either one of holes and electrons, because of a difference in potential energy between the valence and the conduction bands, and a difference in effective mass of holes and electrons in the first layer W and the second layer B. Namely, the optimum thickness for reflecting electrons is not optimum for reflecting holes. Eqs. 5–10 refer to a structure of the quantum-wave interference layer for reflecting electrons selectively. The thickness for selectively reflecting electrons is designed based on a difference in potential energy of the conduction band and effective mass of electrons. Further, the thickness for selectively reflecting holes is designed based on a difference in potential energy of the valence band and effective mass of holes, realizing another type of quantum-wave interference layer for reflecting only holes and allowing electrons to pass through.

Forming the quantum-wave interference layer of electrons in the p-layer and that of holes in the n-layer enables to vary V-I characteristic of the diode more abruptly and lower its dynamic resistance notably.

(fifth aspect of the invention)

As shown in FIG. 3, a plurality of partial quantum-wave interference layers $I_k$ may be formed corresponding to each of a plurality of kinetic energy levels $E_k$. Each of the partial quantum-wave interference layers $I_k$ has $T_k$ periods of a pair of a first layer W and a second layer B whose respective thicknesses ($D_{Wk}$, $D_{Bk}$) are determined by Eqs. 3 and 4. The plurality of the partial quantum wave interference layer $I_k$ is arranged in series with respect to the number k of kinetic energy levels $E_k$. That is, the quantum-wave interference layer is formed by a serial connection of $I_1, I_2, \ldots,$ and $I_j$. As shown in FIG. 3, electrons with each of the kinetic energy levels $E_k$ are reflected by the corresponding partial quantum-wave interference layers $I_k$. Accordingly, electrons belonging to each of the kinetic energy levels from $E_1$ to $E_j$ are reflected effectively. By designing the intervals between the kinetic energies to be short, thicknesses of the first layer W and the second layer B ($D_{Wk}$, $D_{Bk}$) in each of the partial quantum-wave interference layers $I_k$ vary continuously with respect to the value k.

(sixth aspect of the invention)

As shown in FIG. 4, a plurality of partial quantum-wave interference layers may be formed with an arbitrary period. Each of the partial quantum-wave interference layers, $I_1, I_2, \ldots$ is made of serial pairs of the first layer W and the second layer B with widths ($D_{Wk}$, $D_{Bk}$) determined by Eqs 3 and 4. That is, the partial quantum-wave interference layer, e.g., $I_1$, is constructed with serial layers of width ($D_{W1}$, $D_{B1}$), ($D_{W2}$, $D_{B2}$), $\ldots$, ($D_{Wj}$, $D_{Bj}$), as shown. A plurality $I_1, I_2, \ldots$ of layers such as layer $I_1$ are connected in series to form the total quantum wave interference layer. Accordingly, electrons of the plurality of kinetic energy levels $E_k$ are reflected by each pair of layers in each partial quantum-wave interference layers. By designing the intervals between kinetic energies to be short, thicknesses of the pair of the first layer W and the second layer B ($D_{Wk}$, $D_{Bk}$) in a certain partial quantum-wave interference layer varies continuously with respect to the value k.
(second and seventh aspects of the invention)

The second and seventh aspects of the present invention are directed forming a δ layer at the interface between the first layer W and the second layer B. The δ layer has a relatively thinner thickness than both of the first layer W and the second layer B and sharply varies an energy band. Reflectivity R of the interface is determined by Eq. 7. By forming the δ layer, the potential energy V of an energy band becomes larger and the value x of Eq. 7 becomes smaller. Accordingly, the reflectivity R becomes larger.

Variations are shown in FIGS. 5A to 5C. The δ layer may be formed on both ends of the every first layer W as shown in FIGS. 5A to 5C. In FIG. 5A, the δ layers are formed so that an energy level higher than that of the second layer B may be formed. In FIG. 5B, the δ layers are formed so that a band having lower bottom than that of the first layer W may be formed. In FIG. 5C, the δ layers are formed so that the energy level higher than that of the second layer B and the energy level lower than that of the first layer W may be formed. As an alternative to each of the variations shown in FIGS. 5A to 5C, the δ layer can be formed on one end of the every first layer W.

Forming one δ layer realizes large quantum wave reflectivity at the interface between the first layer W and the second layer B and a plurality of the δ layers realizes a larger reflectivity as a whole.
(eighth aspect of the invention)

The eighth aspect of the present invention, or forming a thick second layer $B_O$ at the side of an incident plane of the quantum-wave interference layer, and effectively prevents conduction by tunneling effects and reflects carriers.

BRIEF DESCRIPTION OF THE DRAWING

Other objects, features, and characteristics of the present invention will become apparent upon consideration of the following description and the appended claims with reference to the accompanying drawings, all of which form a part of the specification, and wherein reference numerals designate corresponding parts in the various figures, wherein:

FIG. 3 is an explanatory view of partial quantum-wave interference layers $I_k$ according to the fifth aspect of the present invention;

FIG. 6 is a sectional view showing a first exemplary structure of a diode 100 (Example 1);

DETAILED DESCRIPTION OF THE PREFERRED EMBODIMENT

Figure 1:
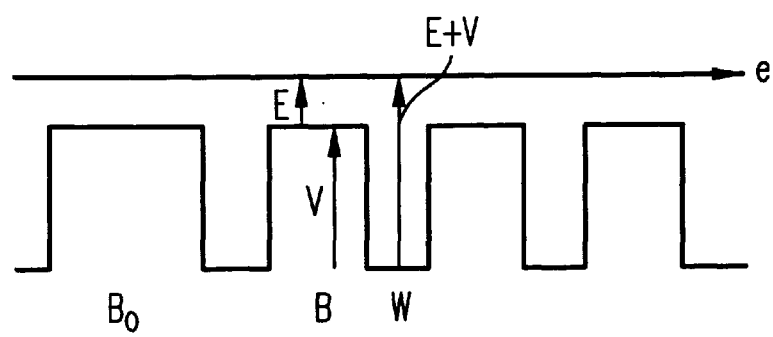
FIG. 1 is an explanatory view of a conduction band of a multi-layer structure according to the first and fourth aspect of the present invention.
Figure 2:
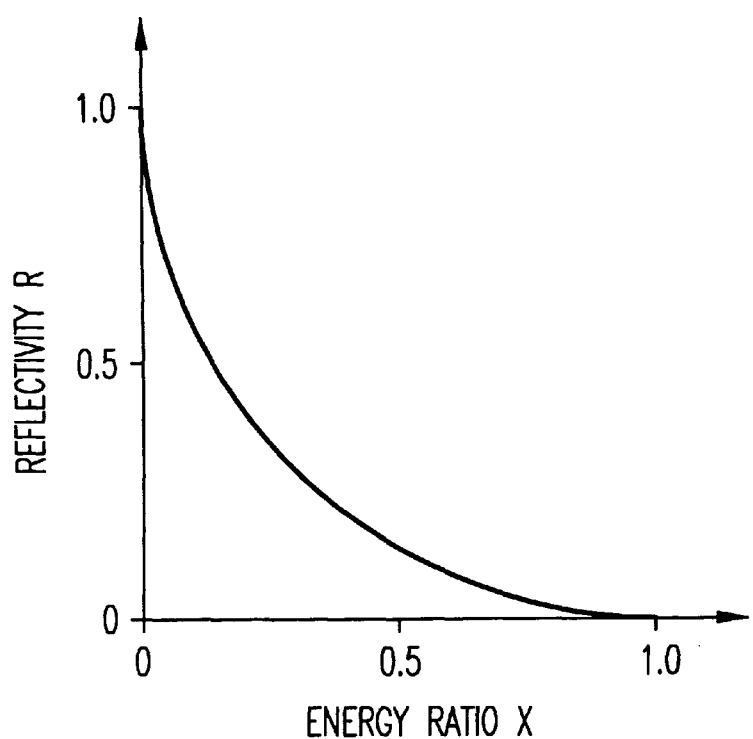
FIG. 2 is a graph showing a relation between an energy ratio x and a reflectivity R.
Figure 4:
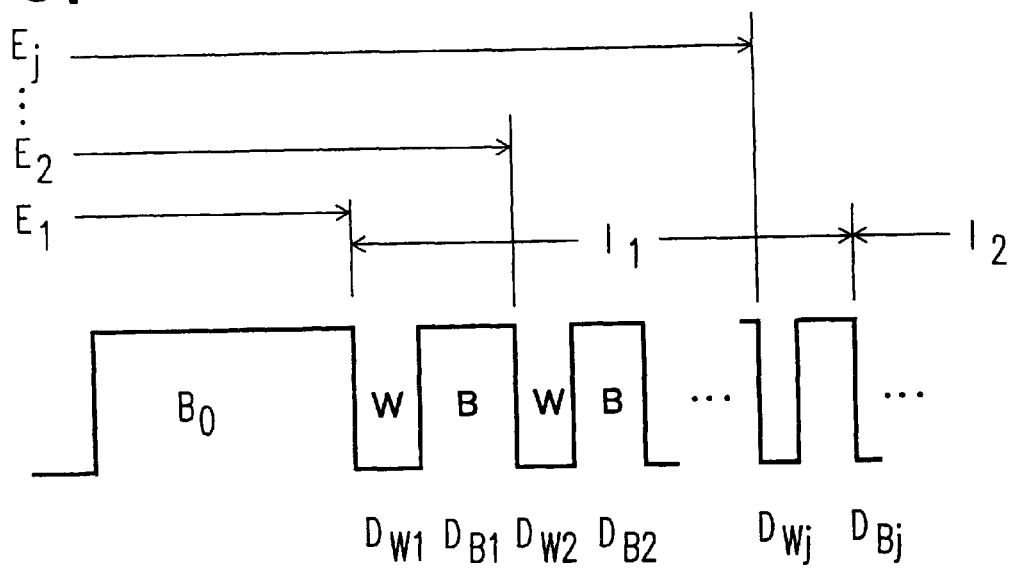
FIG. 4 is an explanatory view of partial quantum-wave interference layers $I_k$ according to the sixth aspect of the present invention.
Figure 5A:
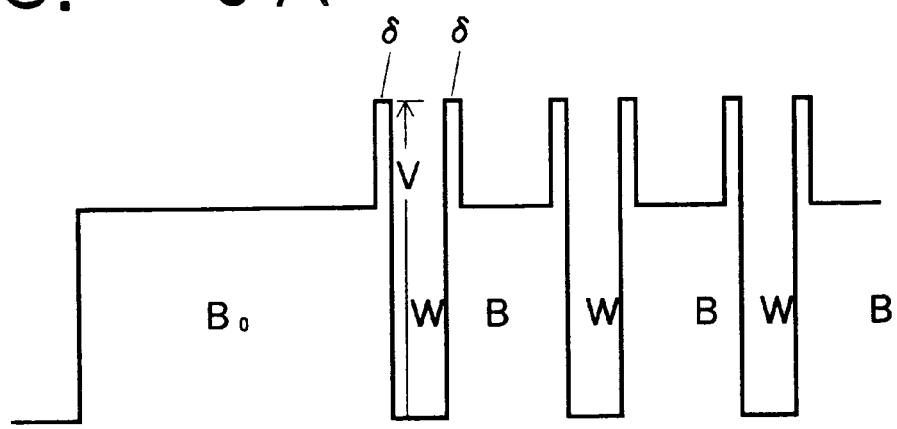
FIG. 5A–C is an explanatory view of δ layers according to the second and seventh aspects of the present invention.
Figure 5B:
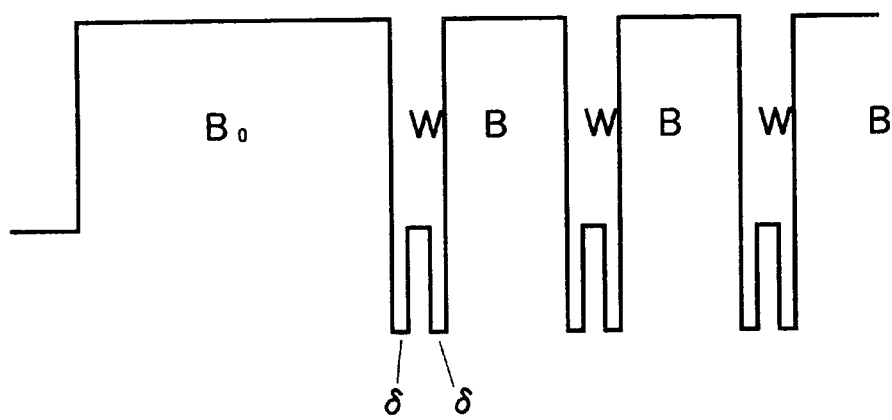
Figure 5C:
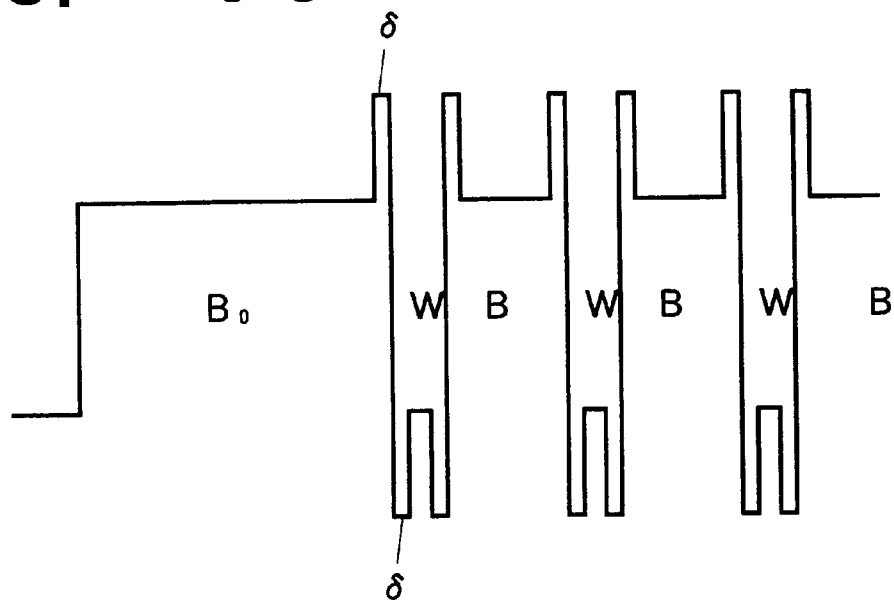

The invention will be more fully understood by reference to the following examples.

EXAMPLE 1

FIG. 6 is a sectional view of a diode 100 in which a quantum-wave interference layer is formed in a p-layer. The diode 100 has a substrate 10 made of gallium arsenide (GaAs). A GaAs buffer layer 12 of n-type conduction, having a thickness generally of 0.3 μm and an electron concentration of $2\times10^{18}/cm^3$, is formed on the substrate 10. An n-$Ga_{0.51}In_{0.49}P$ contact layer 14 of n-type conduction, having a thickness generally of 0.1 μm and electron concentration of $2\times10^{18}/cm^3$, is formed on the buffer layer 12. An n-$Al_{0.51}In_{0.49}P$ n-layer 16, having a thickness generally of 0.5 um and an electron concentration of $1\times10^{18}/cm^3$, is formed on the contact layer 14. An $Al_{0.51}In_{0.49}P$ p-layer 18, having a thickness generally of 0.6 μm, is formed on the cladding layer 16. An electron reflecting layer 20 functioning as a quantum-wave interference layer is formed in the p-layer 18. A p-layer 18a, having a thickness generally of 0.1 μm and a hole concentration of $1\times10^{17}/cm^3$, and a p layer 18b, having a thickness generally of 0.5 μm and a hole concentration of $1\times10^{18}/cm^3$, are formed contact to the incident plane and the output plane of the electron reflecting layer 20. A p-$Ga_{0.51}In_{0.49}P$ second contact layer 22 of p-type conduction, having a thickness generally of 0.1 μm and a hole concentration of $2\times10^{18}/cm^3$, is formed on the p-layer 18b. A p-GaAs first p-type contact layer 24 of p-type conduction, having a thickness generally of 0.1 μm and a hole concentration of $2\times10^{18}/cm^3$, is formed on the second contact layer 22. An electrode layer 26 made of gold and germanium (Au/Ge), having a thickness generally of 0.2 μm, is formed so as to cover the entire back of the substrate 10. Another electrode layer 28 made of gold and zinc (Au/Zn), having a thickness generally of 0.2 μm, is formed on some portion of the first contact layer 24. The substrate 10 has a diameter of 2.0 inch and the normal direction of its main surface is offset toward [011] axis by 15 degree from plane (100).

The diode 100 was manufactured by gas source molecular beam epitaxial deposition (GS-MBE), which is an epitaxial growth method performed under extremely a high vacuum condition. GS-MBE is different from a conventional MBE, which supplies group III and V elements both from the solid sources. In GS-MBE, group III elements such as indium (In), gallium (Ga), and aluminum (Al) are supplied from a solid source and group V elements such as arsenic (As) and phosphorus (P) are supplied by heat decomposition of gas material such as $AsH_3$ and $PH_3$.

Figure 7A:
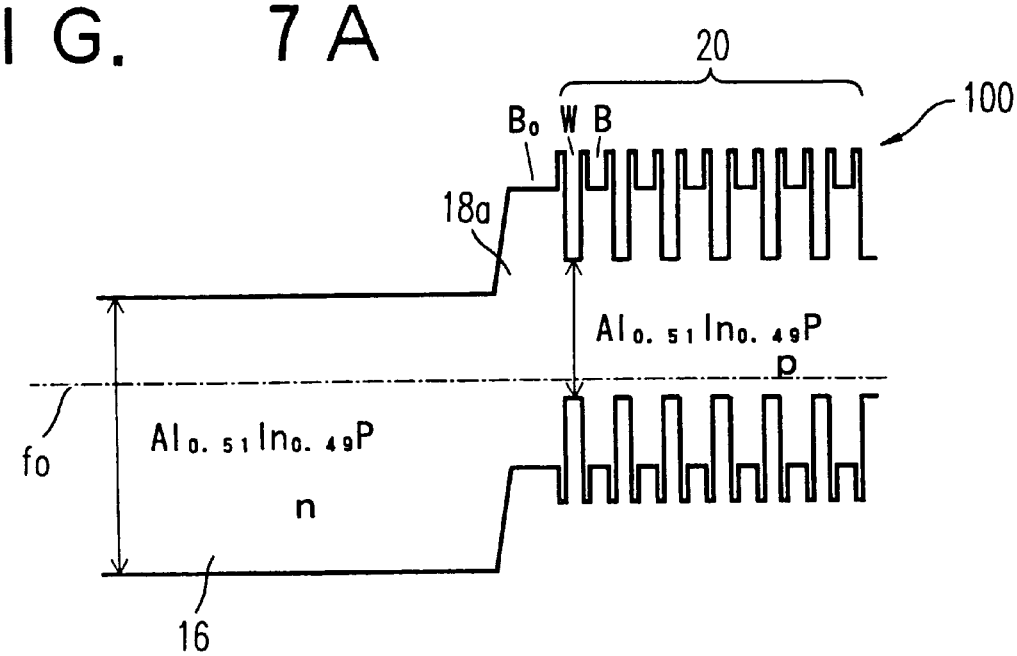
FIGS. 7A–7B are views showing energy diagrams of a diode 100 (Example 1)
Figure 7B:
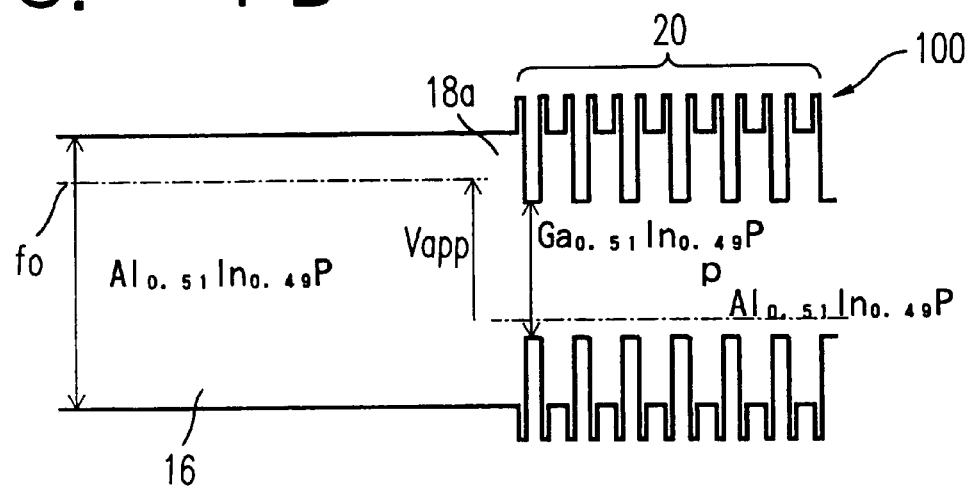
Figure 7C:
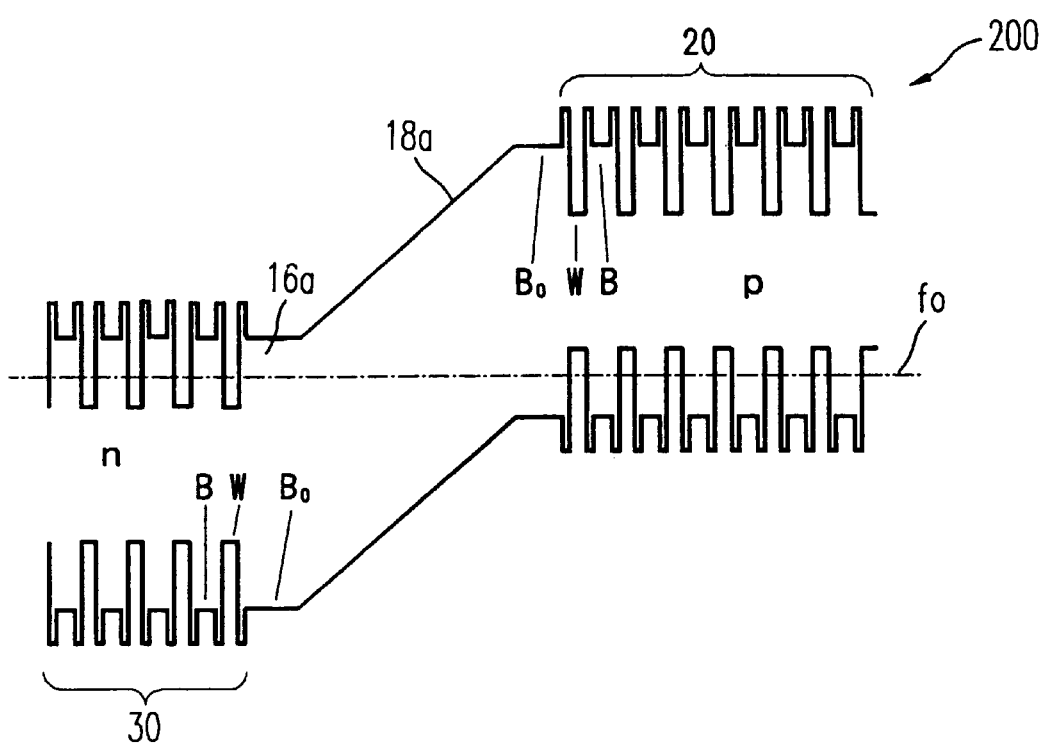
FIG. 7C is a view showing energy diagrams of a diode 200 (Example 2)

In the energy diagrams of FIGS. 7A, 7B and 7C, the n-layer 16, the p-layer 18a, and electron reflecting layer 20 and Fermi level $f_o$ are shown. FIG. 7A shows an energy level of conduction and valence bands on the condition that no external voltage is applied to the diode 100 and FIG. 7B shows the energy level on the condition that the external voltage $V_{app}$ is applied thereto. The electron reflecting layer 20, or a quantum-wave interference layer, has a multi-quantum layer structure with 15 periods of a p-$Ga_{0.51}In_{0.49}P$ well layer as a first layer W and a p-$Al_{0.51}In_{0.49}P$ barrier layer as a second layer B. A δ layer made of p-$Al_{0.33}Ga_{0.33}In_{0.33}P$ is formed at each interface between the first layer W and the second layer B. Thicknesses of the first layer W and the second layer B are respectively determined according to Eqs. 1 and 2. Only the first second layer $B_O$ is designed to have enough thickness to prevent conduction of carriers by a tunneling effect. The δ layer is formed to have a thickness of 1.3 nm. Accordingly, when the external voltage $V_{app}$ is applied to the diode 100 in the forward direction, electrons injected from the n-layer 16 into the p-layer 18a are reflected effectively by the electron reflecting layer 20 and are not injected into the p-layer 18b (not shown). And the kinetic energy of electrons injected, when the external voltage $V_{app}$ is applied, exceeds the kinetic energy E which designs the electron reflecting layer 20 substantially, the electron reflecting layer 20 does not reflect electron but let them pass through. Consequently, V-I characteristic rises at the voltage when the applied external voltage exceeds a certain threshold.

Although the valence band of the electron reflecting layer 20 also has a multiple period of energy level, holes are designed not to be reflected thereby. The respective thickness of the first layer W and the second layer B in the reflecting layer 20 is designed to reflect electrons only. Therefore, holes injected from the p-layer 18b (not shown) pass through the electron reflecting layer 20 thus reaching the n-layer 16.

Figure 8:
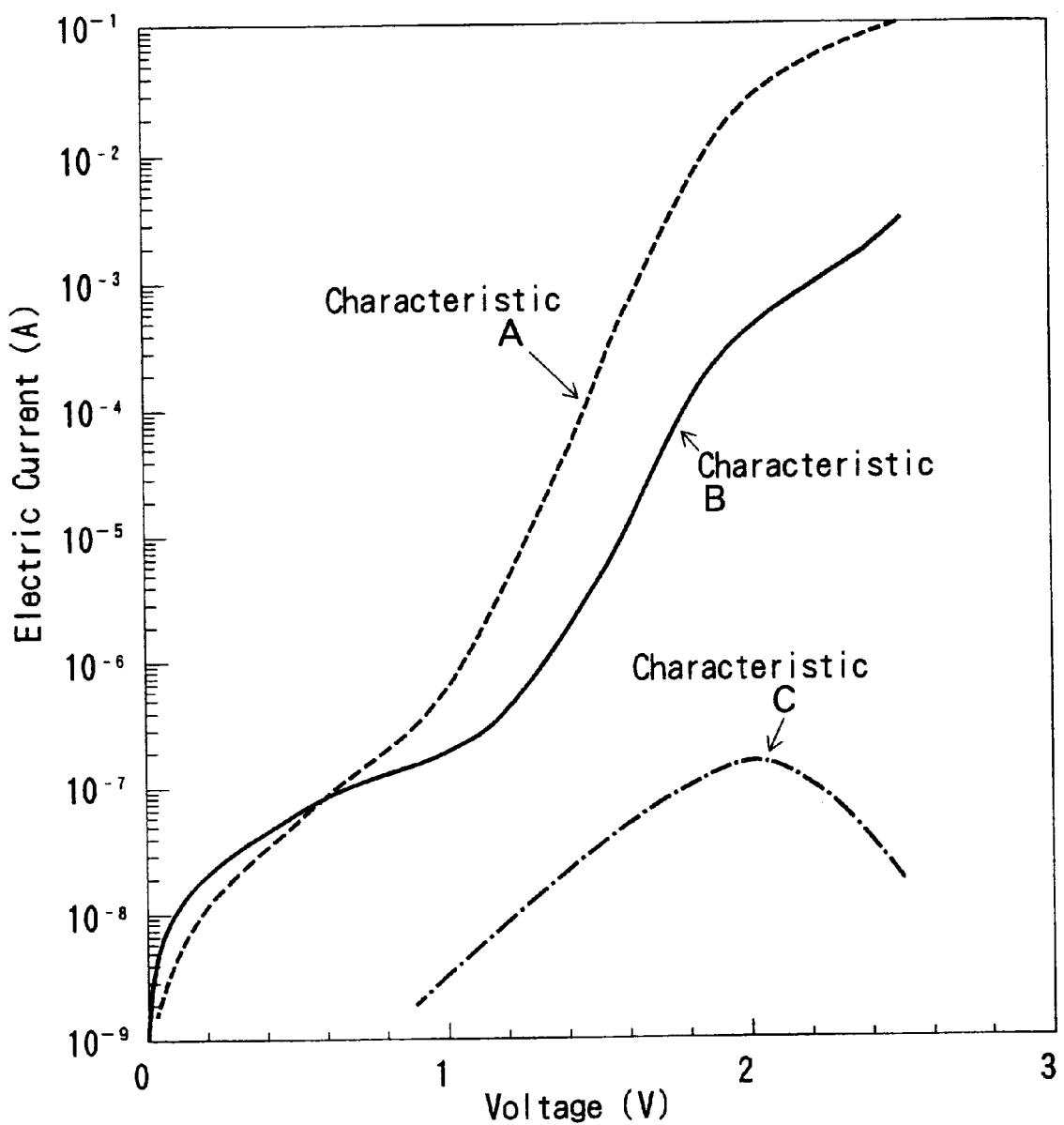
FIGS. 8 and 9 are views showing diagrams of a second exemplary V-I characteristic of a diode (Examples 1 and 2)
Figure 9:
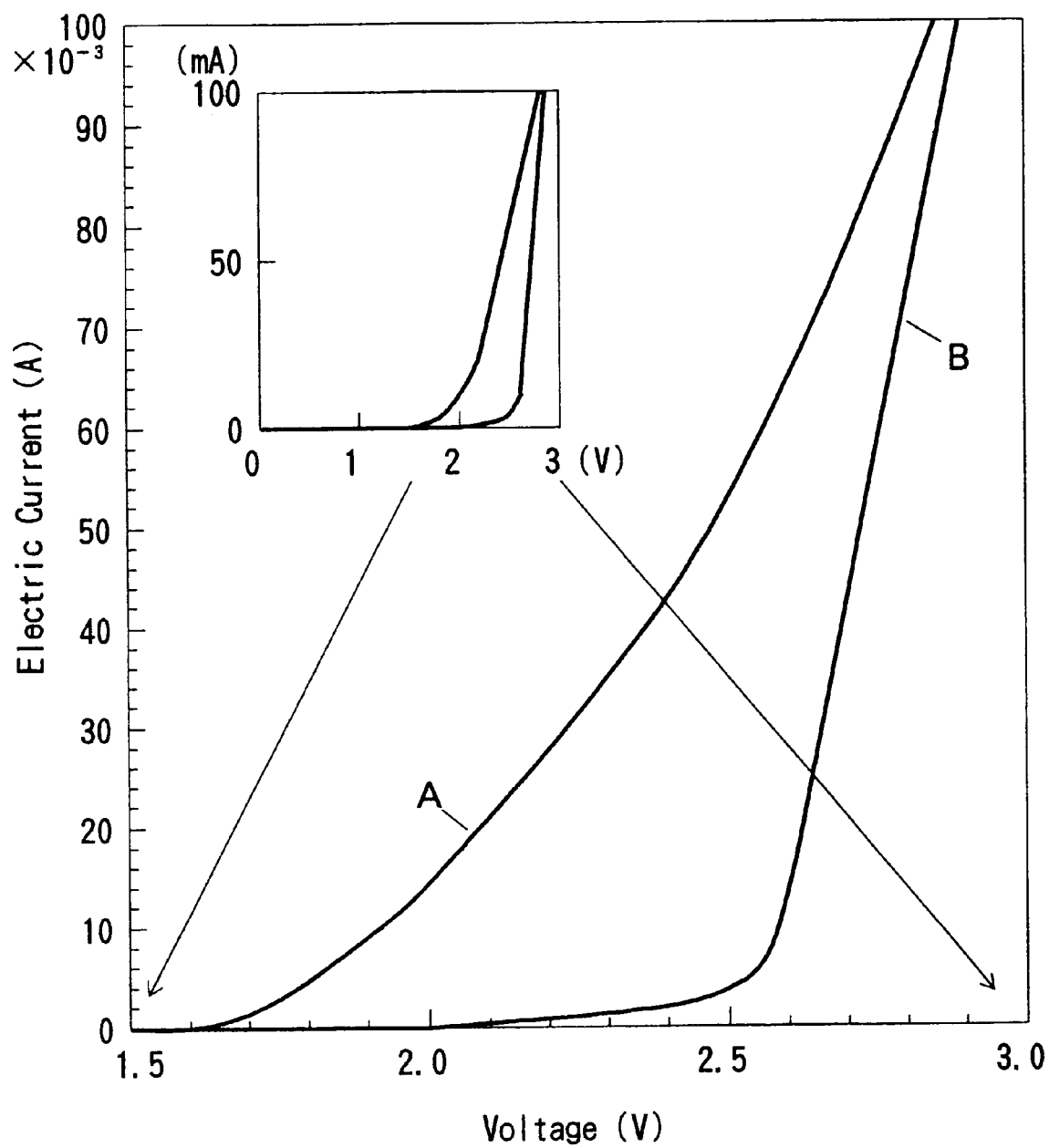

V-I characteristic was measured varying the respective thickness of the first layer W and the second layer B. The thickness of the second layer B was fixed at 7 nm and that of the first layer W was varied. A minimum $\Delta V/\Delta I$ ratio of V-I characteristic, or dynamic resistance, was obtained when the thickness of the first layer W was 5 nm. Then, V-I characteristic was measured fixing the thickness of the first layer W at 5 nm and varying that of the second layer B. When the second layer B has a thickness of 7 nm, dynamic resistance showed its minimum. As a result, the diode 100 with the electron reflecting layer 20 was found to have a minimum dynamic resistance when the first layer W has a thickness of 5 nm and the second layer B has a thickness of 7 nm. FIGS. 8 and 9 show V-I characteristic B. For comparison, a diode without the electron reflecting layer 20, or a pn junction diode of the prior art, was manufactured and its V-I characteristic A was measured. FIG. 8 shows a region of an electric current of V-I characteristic A before it rises rapidly, and also shows that the electric current of the diode 100 is suppressed compared to that of the pr ior diode, a diode without an electron reflecting layer. Characteristic C in FIG. 8 shows a figure of V-I characteristic A minus V-I characteristic B, or an electron quantum-wave reflectivity of the electron reflective layer 20. When the external voltage is about 2V, C shows its peak, or the suppression of electric current is maximum. And the energy which injected electrons may have, when the external voltage is 2V, exceeds the bottom of the conduction band of the second layer B and is consider to correspond to kinetic energy E of electrons used to design the thicknesses of the first layer W and the second layer B. FIG. 9 shows V-I characteristic by linear scale. A dynamic resistance of the diode 100 is dropped to one-fourth compared to that of the prior diode.

EXAMPLE 2

Figure 10:
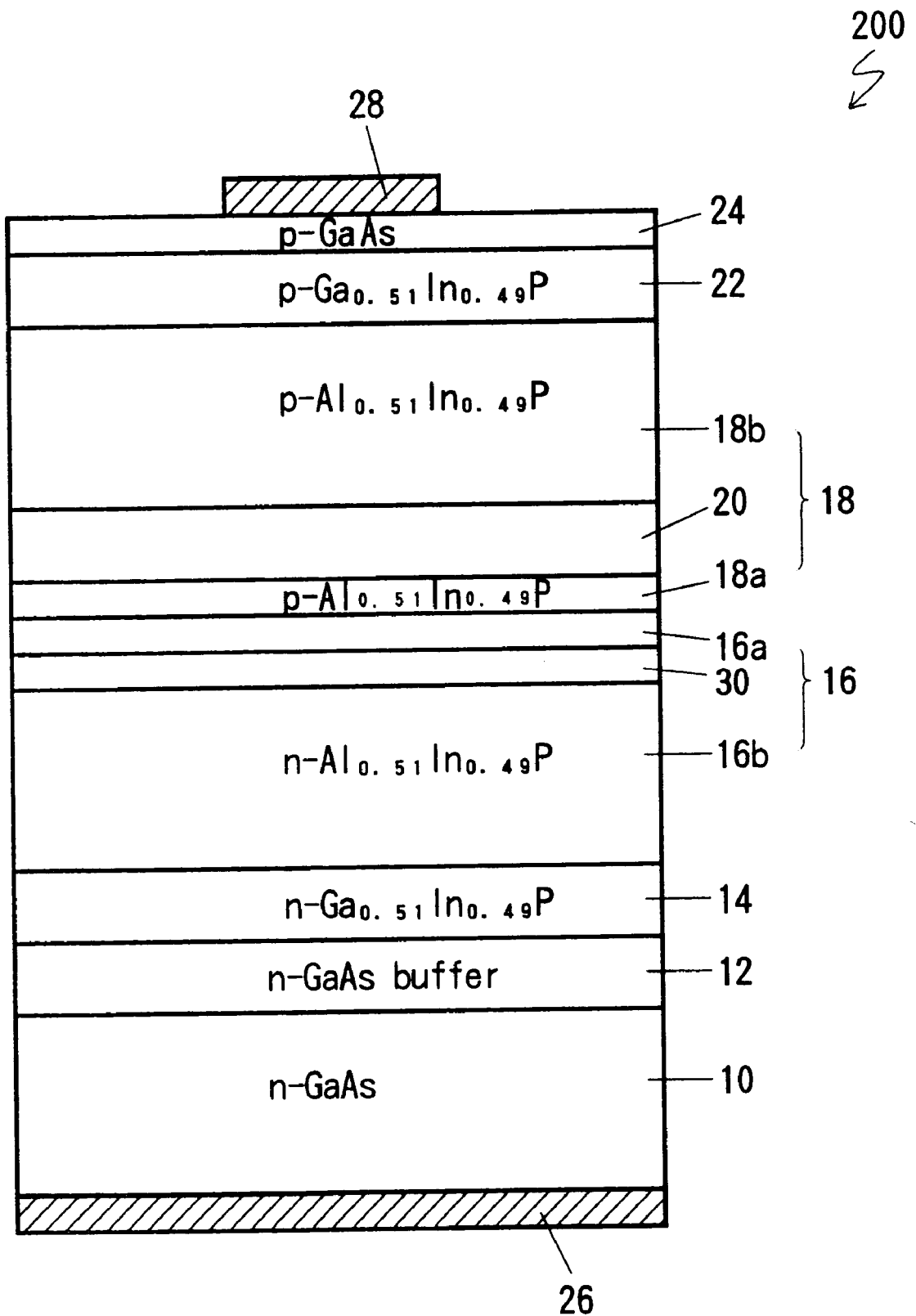
FIG. 10 is a sectional view showing a second exemplary structure of a diode (Example 2).

FIG. 10 shows a diode 200 used in the present embodiment. The diode 200 has a hole reflecting layer 30 additionally to the diode 100 structure for reflecting holes. The hole reflecting layer 30 is formed between the n-layers 16a and 16b. The n-layer 16a, a quantum-wave incident plane of electrons, has an enough thickness to prevent a tunneling current. The hole reflecting layer 30 had the same structure as the electron reflecting layer 20 of the diode 100. The thicknesses of the first layer W and the second layer B are designed to be 1.0 nm and 1.2 nm respectively to reflect holes effectively. As a result, the diode 200 obtained dynamic resistance of one-sixth compared to the diode without the electron reflecting layer 20 and the hole reflecting layer 30.

In the present invention, embodiments of diodes with δ layers are shown as Examples 1 and 2. The reflectivity is more improved by δ layers. Alternatively, a multi-quantum well (MQW) structure without a δ layer can be applied to a diode although its reflectivity will be lowered.

Further, in Examples 1 and 2, a quantum-wave interference layer was formed to have a multi-layer structure made of ternary compounds including $Ga_{0.51}In_{0.49}P$ and $Al_{0.51}In_{0.49}P$. Alternatively, the interference layer can be made of quaternary compounds such as $Al_xGA_yIn_{1-x-y}P$, selecting arbitrary composition ratio within the range of $0 \geq x \geq 1, 0 \geq y \geq 1$, and $0 \geq x+y \geq 1$. As another alternative, the quantum-wave interference layer can be made of group III–V compound semiconductor, group II–VI compound semiconductors, Si and Ge, and semiconductors of other hetero-material.

While the invention has been described in connection with what are presently considered to be the most practical and preferred embodiments, it is to be understood that the invention is not to be limited to the disclosed embodiments, but on the contrary, the description is intended to cover various modifications and equivalent arrangements included within the spirit and scope of the appended claims. The present document claims the benefit of Japanese priority document JP 9-123482, filed in Japan on Apr. 25, 1997, the entire contents of which is incorporated herein by reference.

Obviously, numerous modifications and variations of the present invention are possible in light of the above teachings. It is therefore to be understood that within the scope of the appended claims, the invention may be practiced otherwise than as specifically described herein.

What is claimed is:

1. A diode comprising:
   a quantum-wave interference layer having plural periods of a pair of a first layer and a second layer, said second layer having a wider band gap than said first layer, and said quantum-wave interference layer being formed in at least one of a p-layer and an n-layer; and
   wherein the thickness of said first layer ($D_W$) is equal to:

$$D_W = n_W \lambda_W / 4,$$

where $n_W$ is an odd number and $\lambda_W$ is a quantum-wave wavelength of minority carriers having a kinetic energy (E+V) in the first layer where V is a difference in carrier potential energy between said second layer and said first layer, E is the kinetic energy of said minority carriers in said second layer without external voltage applied and $E \leq V/9$;
   the thickness of said second layer ($D_B$) is equal to:

$$D_B = n_B \lambda_B / 4,$$

where $n_B$ is an odd number and $\lambda_B$ is a quantum-wave wavelength of minority carriers having a kinetic energy E in the second layer.

2. A diode according to claim 1, wherein said minority carriers in said second layer have an energy around the lowest energy level of said second layer.

3. A diode according to claim 1, wherein said wavelength $\lambda_W$ is given by $\lambda_W = h/[2m_W(E+V)]^{1/2}$, said wavelength $\lambda_B$ is given by $\lambda_B = h/(2m_BE)^{1/2}$, where h is Plank's constant, $m_W$ is the effective mass of said minority carriers in said first layer, and $m_B$ is the effective mass of said minority carriers in said second layer.

4. A diode according to claim 1, further comprising a non-tunneling layer composed of the same material as said second layer, said non-tunneling layer being at a quantum-wave incident plane in said quantum-wave interference layer and having enough thickness to prevent conduction of minority carriers by a tunneling effect.

5. A diode according to claim 1, comprising:
a δ layer for sharply varying energy band, being formed between said first and said second layers, and thickness of said δ layer being substantially thinner than the thickness of said first and said second layers.

6. A diode according to claim 5, wherein said minority carriers in said second layer have an energy around the lowest energy level of said second layer.

7. A diode according to claim 5, wherein said wavelength $\lambda_W$ is given by $\lambda_W = h/[2m_W(E+V)]^{1/2}$, said wavelength $\lambda_B$ is given by $\lambda_B = h/(2m_B E)^{1/2}$, where h is Plank's constant, $m_W$ is the effective mass of said minority carriers in said first layer, and $m_B$ is the effective mass of said minority carriers in said second layer.

8. A diode according to claim 5, further comprising a non-tunneling layer composed of the same material as said second layer, said non-tunneling layer being at a quantum-wave incident plane of in said quantum-wave interference layer and having enough thickness to prevent conduction of minority carriers by a tunneling effect.

* * * * *